United States Patent
Lee et al.

(10) Patent No.: US 8,436,666 B2
(45) Date of Patent: May 7, 2013

(54) INTERFACE APPARATUS FOR SEMICONDUCTOR INTEGRATED CIRCUIT AND INTERFACING METHOD THEREOF

(75) Inventors: Ji-Wang Lee, Gyeonggi-do (KR);
Yong-Ju Kim, Gyeonggi-do (KR);
Hee-Woong Song, Gyeonggi-do (KR);
Ic-Su Oh, Gyeonggi-do (KR);
Hyung-Soo Kim, Gyeonggi-do (KR);
Tae-Jin Hwang, Gyeonggi-do (KR);
Hae-Rang Choi, Gyeonggi-do (KR);
Jae-Min Jang, Gyeonggi-do (KR);
Chang-Kun Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 306 days.

(21) Appl. No.: 12/650,122

(22) Filed: Dec. 30, 2009

(65) Prior Publication Data

US 2011/0156772 A1  Jun. 30, 2011

(30) Foreign Application Priority Data

Dec. 29, 2009 (KR) .................. 10-2009-0133391

(51) Int. Cl.
*H03K 3/017* (2006.01)
*H03K 5/04* (2006.01)
*H03K 7/08* (2006.01)

(52) U.S. Cl.
USPC ............................ 327/171; 327/236; 327/243

(58) Field of Classification Search .................. 327/171, 327/236, 5, 243
See application file for complete search history.

(56) References Cited

U.S. PATENT DOCUMENTS

| 6,002,282 | A | 12/1999 | Alfke |
| 6,370,200 | B1 * | 4/2002 | Takahashi ................. 375/257 |
| 6,642,761 | B1 | 11/2003 | Tien |
| 7,633,313 | B2 * | 12/2009 | Goh et al. .................. 326/86 |
| 7,893,746 | B1 * | 2/2011 | Zheng et al. ............... 327/263 |
| 2006/0256880 | A1 * | 11/2006 | Frisch ........................ 375/257 |
| 2008/0139157 | A1 * | 6/2008 | Kerth et al. ................ 455/296 |
| 2009/0174448 | A1 * | 7/2009 | Zabinski .................... 327/161 |

FOREIGN PATENT DOCUMENTS

KR 10-2005-0020141 A 3/2005
KR 10-2008-0044543 A 5/2008

* cited by examiner

*Primary Examiner* — Ryan Jager
(74) *Attorney, Agent, or Firm* — IP & T Group LLP

(57) ABSTRACT

An interface apparatus for a semiconductor integrated circuit and an interfacing method thereof controls the VOX of differential signals to a target level in response to the differential signals being outputted by an output block. The interface apparatus for a semiconductor integrated circuit includes an output block configured to output differential signals output by an internal circuit a detector configured to detect a timing error of the differential signals; and a controller configured to control a timing of the differential signals output by the internal circuit according to a detection result of the detector.

18 Claims, 9 Drawing Sheets

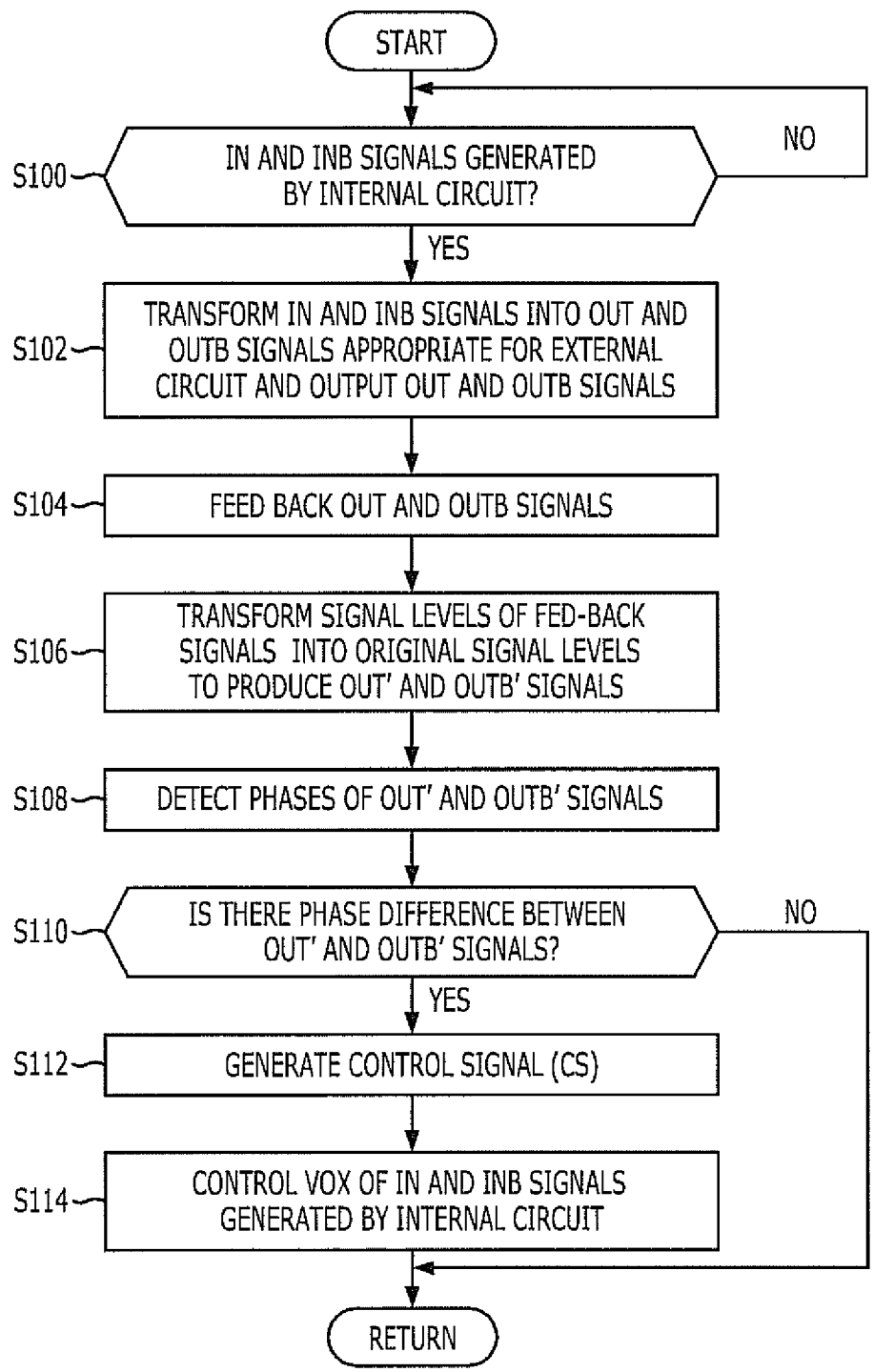

FIG. 8
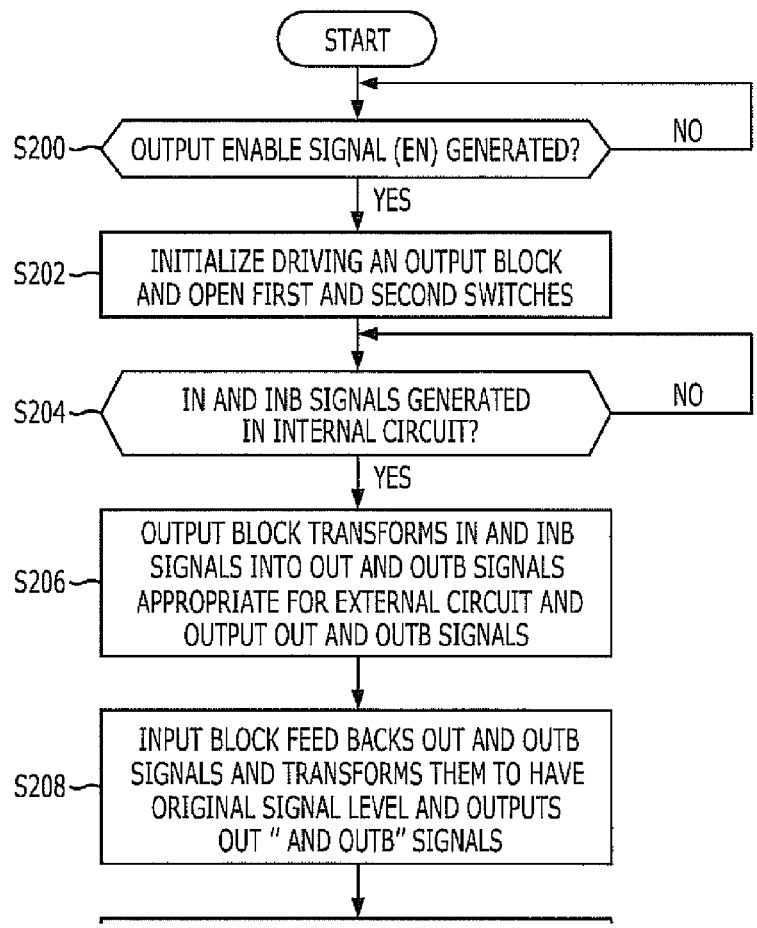
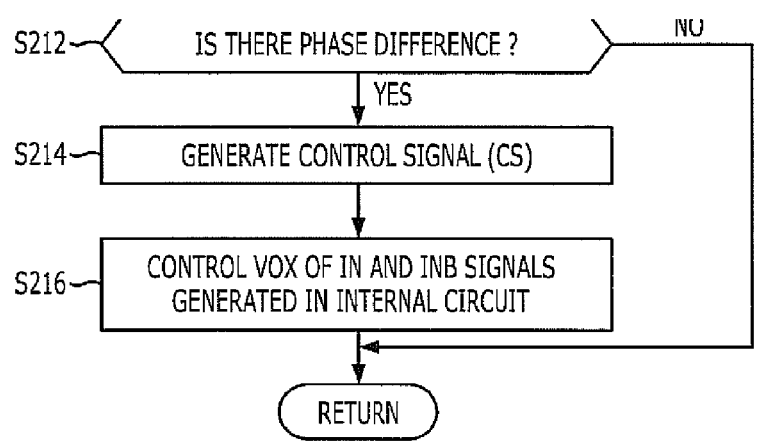

INTERFACE APPARATUS FOR SEMICONDUCTOR INTEGRATED CIRCUIT AND INTERFACING METHOD THEREOF

CROSS-REFERENCE TO RELATED APPLICATION

The present application claims priority of Korean Patent Application No. 10-2009-0133391, filed on Dec. 29, 2009, which is incorporated herein by reference in its entirety.

BACKGROUND OF THE INVENTION

Exemplary embodiments of the present invention relate to a semiconductor integrated circuit, and more particularly, to an interface apparatus of a semiconductor integrated circuit and an interfacing method thereof.

Recently designed semiconductor integrated circuits (ICs) require a high degree of integration, low power consumption, and a high operating speed. To fulfill these requirements, semiconductor integrated circuits are equipped with an interface apparatus for transmitting/receiving a signal/bar signal to/from an external circuit. Herein, the signal/bar signal includes a data signal and a data bar signal (that is, a logically inverted data signal), an address signal and an address bar signal (that is, a logically inverted address signal), and a command signal and a command bar signal (that is, a logically inverted command signal).

The interface apparatus of a semiconductor integrated circuit may include an input block having a plurality of receivers (Rx) each for receiving a signal or a bar signal from an external circuit. The interface apparatus of a semiconductor integrated circuit may also include an output block having a plurality of transmitters (Tx) each for transmitting a signal or a bar signal to the external circuit. The interface apparatus of a semiconductor integrated circuit may be bi-directional by including both an input block and an output block respectively having a plurality of receivers and transmitters. Generally, the input block, the output block, and the bi-directional structure including both an input block and an output block are arranged along with pads for simplifying design automation.

However, the interface apparatuses of conventional semiconductor integrated circuits including the output block and the bi-directional structure having both an input block and an output block have the following drawbacks.

When a voltage level VOX of a signal and a bar signal outputted by the output block are outside of a set range, a bit error may occur in an input block of an external circuit. Herein, "VOX" represents a voltage level of a cross point of the signal and the bar signal outputted by the output block.

Since no conventional technology provides a method for directly detecting the VOX, the VOX is indirectly detected by detecting jitter. When the VOX is converted into a time domain, it becomes jitter, and the fact that the cross point of a signal and a bar signal between a power source voltage VDD and a ground voltage VSS varies with a swing level indicates that a timing error has occurred. Therefore, when jitter is detected, the VOX is indirectly detected.

Conventional technologies use an oversampling method based on interpolation in order to detect jitter of a signal and a bar signal outputted by an output block. However, the conventional technologies have a drawback in that the interpolation and oversampling processes are too complicated to be simply realized in the output block. Moreover, since the output block characteristically occupies a large volume and since it includes a circuit having a high power consumption, the output path through which a data is outputted by the output block to an external circuit takes less time than an input path through which data is inputted from the input block to the internal circuitry of an integrated circuit. Therefore, it is difficult to add a circuit requiring a delay.

Consequently, it is desirable for a circuit for detecting the VOX to have a small volume, low power consumption and a short time delay.

SUMMARY OF THE INVENTION

An embodiment of the present invention is directed to an interface apparatus for a semiconductor integrated circuit for controlling a VOX of a differential signal to be within a set range when the differential signal is outputted by an output block, and an interfacing method thereof.

In accordance with an embodiment of the present invention, an interface apparatus for a semiconductor integrated circuit includes: an output block configured to output differential signals generated by an internal circuit; a feed back block configured to feed back the differential signals outputted by the output block; a detector configured to detect a timing error of the differential signals; and a controller configured to control a timing of the differential signals generated by the internal circuit based on a detection result of the detector.

In accordance with another embodiment of the present invention, an interfacing method of a semiconductor integrated circuit includes: outputting differential signals generated by an internal circuit through an output block; feeding back the differential signals outputted by the internal circuit; detecting a timing error of the differential signals; and controlling a timing of the differential signals generated by the internal circuit based on a timing error detection result.

In accordance with yet another embodiment of the present invention, an interfacing method of a semiconductor integrated circuit includes: detecting a timing error and storing the timing error detection value during an initial operation period; and controlling timing of differential signals and outputting the differential signals with a controlled timing through a pad according to the stored detection value in response to the differential signals being output by an internal circuit during an active operation period.

BRIEF DESCRIPTION OF THE DRAWINGS

FIG. 5 is a flowchart illustrating an interfacing method of the interface apparatus in accordance with the first embodiment of the present invention.

FIG. 8 is a flowchart illustrating an interfacing method of the interface apparatus in accordance with the second embodiment of the present invention.

DESCRIPTION OF THE INVENTION

Figure 1:
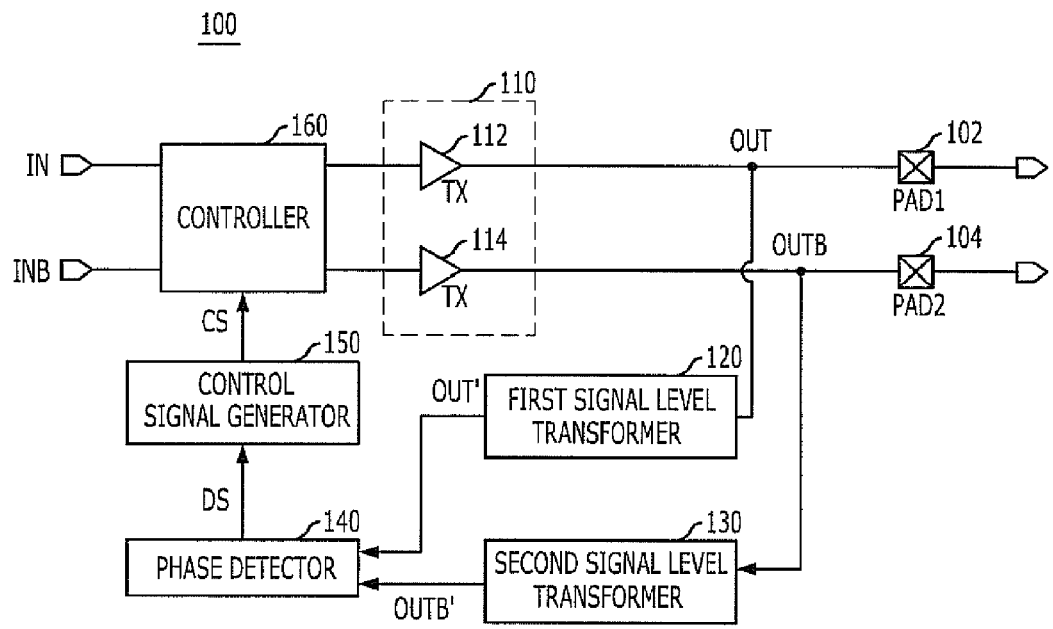
FIG. 1 is a block diagram illustrating an interface apparatus for a semiconductor integrated circuit in accordance with a first embodiment of the present invention.

Exemplary embodiments of the present invention are described below in more detail with reference to the accompanying drawings. The present invention may, however, be embodied in different forms and should not be constructed as being limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various drawing figures and embodiments of the present invention.

The drawings are not necessarily to scale and in some instances, proportions may have been exaggerated in order to clearly illustrate features of the embodiments of the present invention.

Figure 2:
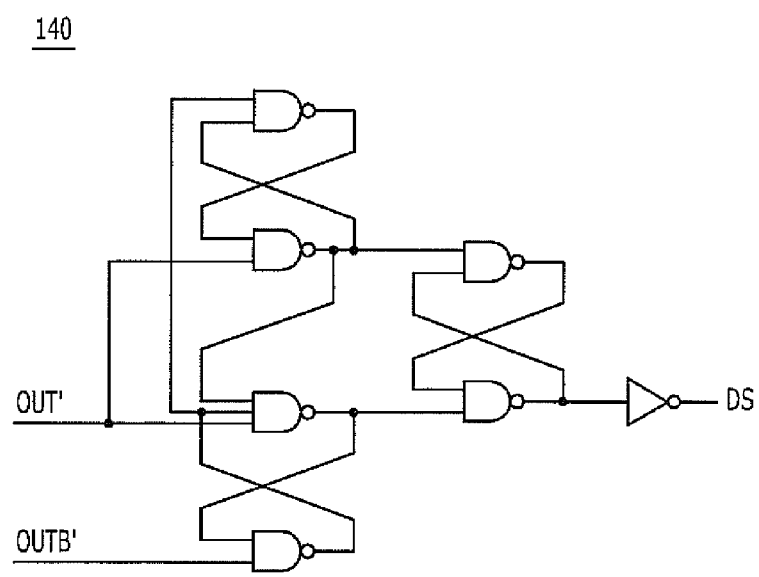
FIG. 2 illustrates a phase detector shown in FIG. 1.
Figure 3A:
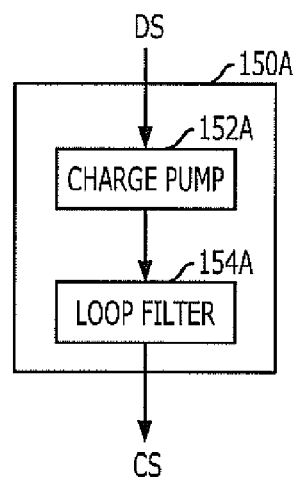
FIGS. 3A to 3C are block diagrams respectively illustrating an analog control signal generator and two digital control signal generators.
Figure 3B:
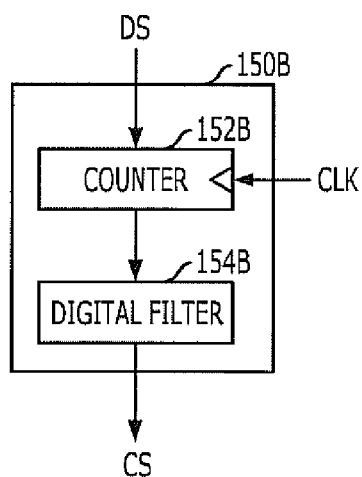
Figure 3C:
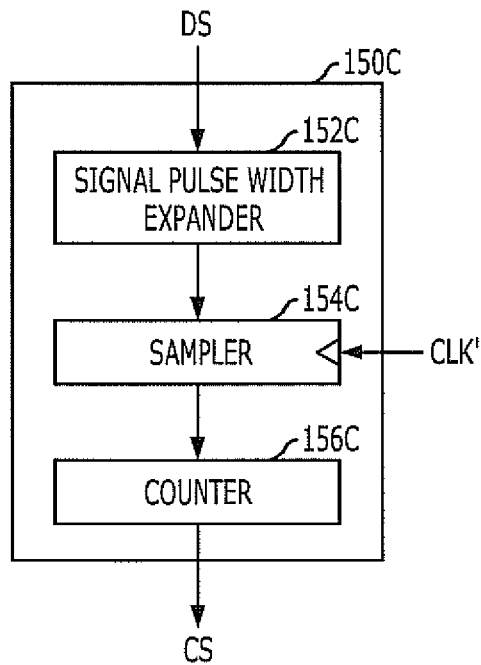
Figure 4A:
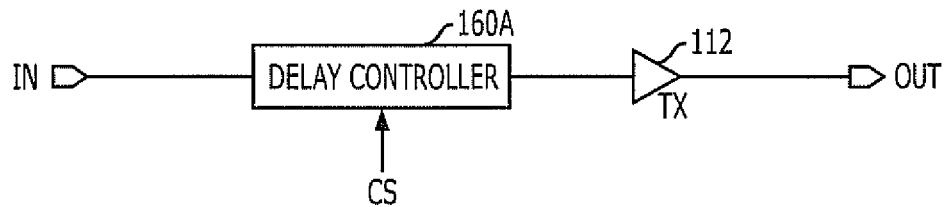
FIGS. 4A and 4B illustrate a controller arranged within an output block in FIG. 1.
Figure 4B:
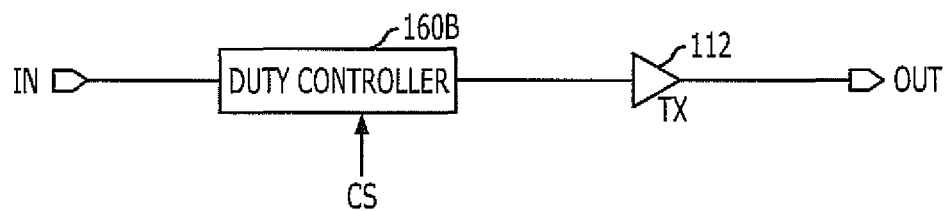

FIG. 1 is a block diagram illustrating an interface apparatus for a semiconductor integrated circuit in accordance with a first embodiment of the present invention. FIG. 2 illustrates a phase detector shown in FIG. 1. FIGS. 3A to 3C are block diagrams describing an analog control signal generator and two digital control signal generators. FIGS. 4A and 4B illustrate a controller shown in FIG. 1 along with a first output buffer.

In the first embodiment, a one-directional interface apparatus including an output block has been selected as an example and is described as follows. Referring to FIG. 1, an interface apparatus 100 provided within a semiconductor integrated circuit (IC) includes an output block 110, which buffers a signal IN and a bar signal INB generated by an internal circuit (not shown) of the semiconductor integrated circuit and outputs the buffered signals to an external circuit (not shown) through a first pad 102 (PAD1) and a second pad 104 (PAD2). The output block 110 includes a first output buffer 112 and a second output buffer 114, which respectively transform the signal levels of the signal IN and the bar signal INB generated by the internal circuit into signal levels appropriate for the external circuit, and transfer the transformed signals, which are an output signal OUT and an output bar signal OUTB, to the external circuit. The first and second output buffers 112 and 114 may be conventional transmitters. The signal IN and the bar signal INB may include a data signal and a data bar signal, an address signal and an address bar signal, and a command signal and a command bar signal.

The interface apparatus 100 also includes a first signal level transformer 120 and a second signal level transformer 130, which respectively receive the output signal OUT and the output bar signal OUTB fed back from the output block 110 and transform their signal levels back to their original signal levels. The first and second signal level transformers 120 and 130 may be inverters or amplifiers.

The interface apparatus 100 also includes a phase detector 140, which receives output signals OUT' and OUTB' of the first and second signal level transformers 120 and 130 and outputs a detection signal DS based on a phase difference value between the output signals OUT' and OUTB'. The detection signal DS is outputted as either a logic high level or a logic low level. The phase detector 140 performs a sampling of the output signal OUT' of the first signal level transformer 120 based on the output bar signal OUTB' of the second signal level transformer 130, as illustrated in FIG. 2. However, the structure of the phase detector 140 is not limited to the structure illustrated in FIG. 2 and there may be diverse modifications. For example, the phase detector 140 may output the detection signal DS as a pulse-type signal. A VOX may be indirectly measured from the detection signal DS of the phase detector 140. The VOX represents a voltage level of a cross point of the output signal OUT and the output bar signal OUTB outputted by the output block 110. Therefore, whether or not a timing error has occurred may be determined by indirectly measuring the VOX in the phase detector 140.

The interface apparatus 100 also includes a control signal generator 150, which outputs a control signal CS for controlling a controller 160, which is described below, in response to the detection signal DS outputted by the phase detector 140. The control signal generator 150 may be an analog control signal generator or a digital control signal generator. An analog control signal generator generates an analog control signal, and a digital control signal generator generates a digital control signal.

Referring to FIG. 3A, an analog control signal generator 150A includes a charge pump 152A for supplying an output current corresponding to the inputted detection signal DS and a loop filter 154A for outputting an analog control signal CS of a predetermined voltage level in response to the output current supplied by the charge pump 152A.

Referring to FIG. 3B, a first digital control signal generator 150B includes a counter 152B for counting the logic high level or logic low level of the detection signal DS outputted by the phase detector 140 based on a clock signal CLK, and a digital filter 154B for outputting a digital control signal CS by filtering an output signal of the counter 152B.

Referring to FIG. 3C, a second digital control signal generator 150C has a structure to be applied when the detection signal DS of the phase detector 140 is outputted as a pulse signal. The second digital control signal generator 150C indirectly measures the VOX based on the pulse width of the detection signal DS. The second digital control signal generator 150C includes a signal pulse width expander 152C, a sampler 154C, and a counter 156C. The signal pulse width expander 152C expands the pulse width of the detection signal DS to a set pulse width. The sampler 154C performs sampling on an inputted clock signal CLK' during a pulse duration defined by an output signal of the signal pulse width expander 152C. The counter 156C counts the sampled clock signal CLK' produced by the sampler 154C and outputs a digital control signal CS. The signal pulse width expander 152C may be a skewed delay circuit.

The analog and digital control signal generators 150A to 150C may not have the above-described structures and they may have their structure modified according to the intention or preference of a designer.

Referring back to FIG. 1, the interface apparatus 100 also includes a controller 160 for controlling the VOX of the signal IN and the bar signal INB generated by the internal circuit upon receipt of the control signal CS outputted by the control signal generator 150. In the embodiments of the present invention, controlling the VOX signifies controlling the delay or duty cycle of the signal IN and the bar signal INB. In other words, the controller 160 may be a delay controller 160A to control the delay of the signal IN generated by the internal circuit in response to the control signal CS of the control signal generator 150 and to output the delay-controlled signal to the first output buffer 112, as illustrated in FIG. 4A, or it may be a duty cycle controller 160B to control the duty cycle of the signal IN generated by the internal circuit in response to the control signal CS of the control signal generator 150 and to output the duty cycle-controlled signal to the first output buffer 112, as illustrated in FIG. 4B. The delay controller 160A and the duty cycle controller 160B may be formed in such a manner that when the delay controller 160A or the duty cycle controller 160B does not operate, the signal IN and the bar signal INB generated by the internal circuit are transferred to the first output buffer 112, bypassing the delay controller 160A or the duty cycle controller 160B. For the sake of convenience in description, only a line for the signal IN is described in FIGS. 4A and 4B. However, it is apparent that the same may be applied to a line for the bar signal INB as well.

Hereafter, an interfacing method for a semiconductor integrated circuit having the above structure in accordance with a first embodiment of the present invention is described by referring to FIGS. 5 and 6.

Figure 6A:
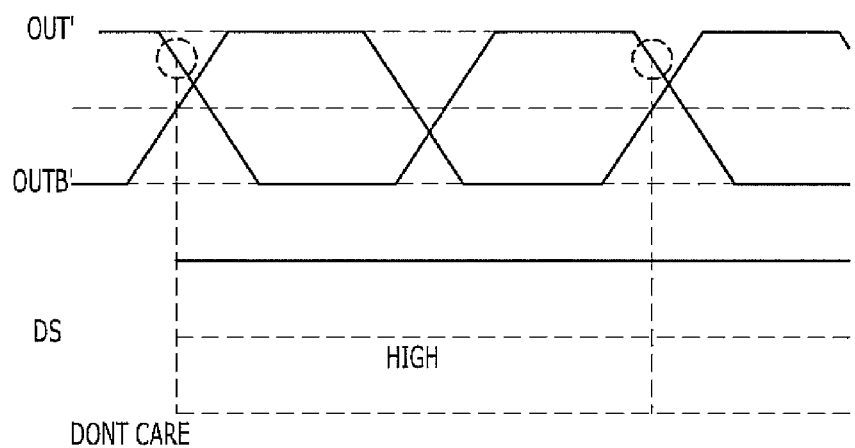
FIGS. 6A and 6B are timing diagram of a detection signal based on a phase difference of a signal and a bar signal fed back in FIG. 5.
Figure 6B:
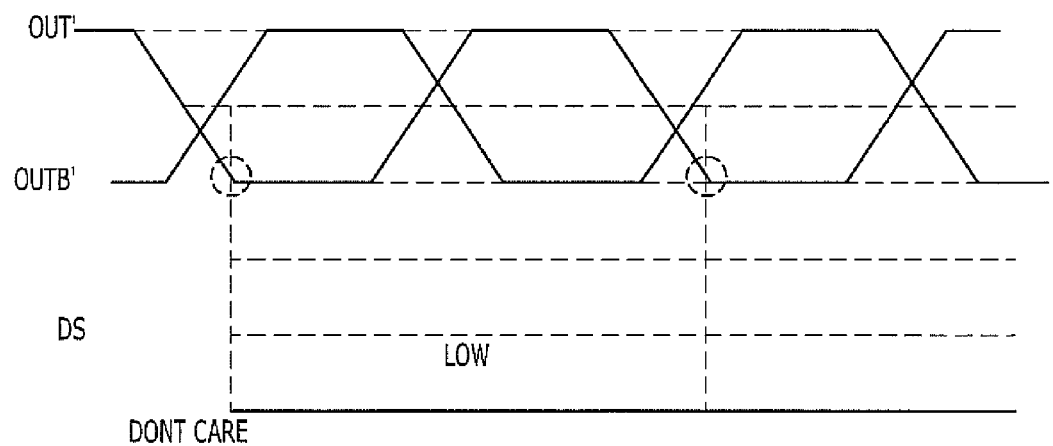

FIG. 5 is a flowchart illustrating an interfacing method of the interface apparatus in accordance with the first embodiment of the present invention. FIGS. 6A and 6B are timing diagrams of a detection signal outputted based on a phase difference between the signal and the bar signal fed back in FIG. 5.

Herein, it is assumed in the description of the first embodiment that controlling the VOX corresponds to controlling a time delay.

Referring to FIG. 5, in step S100, a signal IN and a bar signal INB generated by an internal circuit of a semiconductor integrated circuit are transferred to an output block 110 by bypassing a delay controller 160A. In step S102, the output block 110 transforms the received signal IN and bar signal INB to have signal levels appropriate for an external circuit and outputs resultant signals of the transformed signal levels, which are an output signal OUT and an output bar signal OUTB.

In step S104, the output signal OUT and the output bar signal OUTB, which are produced by the output block 110, are fed back. In step S106, a first signal level transformer 120 and a second signal level transformer 130 respectively transform the signal levels of the output signal and output bar signal OUT and OUTB back to their original levels and output the resultant signals OUT' and OUTB' to a phase detector 140.

In step S108, the phase detector 140 detects a phase difference between the output signals OUT' and OUTB' and, in step S110, outputs a detection signal DS corresponding to the detected phase difference. Referring to FIG. 6A, when the output signal OUT' is at a logic high level at the rising edge of the output bar signal OUTB', the phase detector 140 outputs a detection signal DS of a logic high level and maintains the logic level of the detection signal DS until the rising edge of the next output bar signal OUTB'. Conversely, referring to FIG. 6B, when the output signal OUT' is at a logic low level at the rising edge of the output bar signal OUTB', the phase detector 140 outputs a detection signal DS of a logic low level and maintains the logic level of the detection signal DS until the rising edge of the next output bar signal OUTB'. The VOX is indirectly measured from the detection signal DS outputted as described above.

Referring back to FIG. 5, in step S112, a control signal generator 150 generates either an analog control signal CS or a digital control signal CS in response to the detection signal DS outputted by the phase detector 140 and the generated analog or digital control signal CS is output to the delay controller 160A.

The delay controller 160A controls a delay of the signal IN and the bar signal INB transferred from the internal circuit to the output block 110 based on the received analog or digital control signal CS. In other words, the delay controller 160A controls the VOX of the signal IN and the bar signal INB to a normal level, which may be referred to as a target level. In this embodiment, controlling the VOX corresponds to controlling the delay of the signal IN and the bar signal INB for the sake of convenience in description. However, it is apparent to those skilled in the art that a duty cycle controller 160B may be used to control a duty cycle.

According to the first embodiment of the present invention, outputting the signal IN and bar signal INB with their VOX controlled to the target level improves the reliability of an interface apparatus of a semiconductor integrated circuit.

Figure 7:
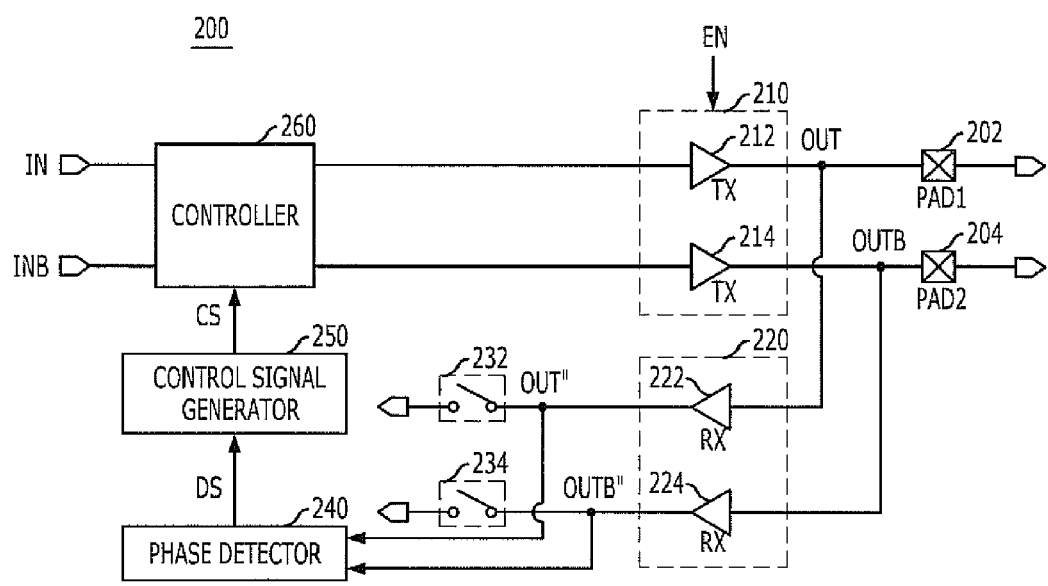
FIG. 7 is a block diagram illustrating an interface apparatus of a semiconductor integrated circuit in accordance with a second embodiment of the present invention.

FIG. 7 is a block diagram illustrating an interface apparatus of a semiconductor integrated circuit in accordance with a second embodiment of the present invention. In the second embodiment, a bi-directional interface apparatus of a semiconductor integrated circuit including both an output block and an input block has been chosen as a representative example and is described as follows.

Referring to FIG. 7, an interface apparatus 200 includes an output block 210, which is driven by an output enable signal EN upon an output signal OUT and an output bar signal OUTB being outputted to a first input/output pad 202 and a second input/output pad 204. The output block 210 includes a first output buffer 212 and a second output buffer 214 which may be conventional transmitters. The first output buffer 212 and the second output buffer 214 respectively transform the signal levels of a signal IN and a bar signal INB generated by an internal circuit of a semiconductor integrated circuit into signal levels appropriate for the external circuit, and transfer the transformed signals, which are an output signal OUT and an output bar signal OUTB, to the external circuit.

The interface apparatus 200 also includes an input block 220 which is driven when a signal and a bar signal (not shown) are inputted through the first input/output pad 202 and the second input/output pad 204. The input block 220 includes a first input buffer 222 and a second input buffer 224, which may be conventional receivers. The first input buffer 222 and the second input buffer 224 transform the signal levels of the signal and the bar signal transferred from the external circuit into signal levels appropriate for the internal circuit of the semiconductor integrated circuit. The input block 220 is controlled to be driven when the output block 210 is driven, and the input block 220 performs a function of feeding back the output signal OUT and the output bar signal OUTB outputted by the output block 210.

To this end, the interface apparatus 200 further includes a first switch 232 and a second switch 234 which open or close a signal transmission path between the input block 220 and the internal circuit when the input block 220 feeds back the output signal OUT and the output bar OUTB signal output by the output block 210, In other words, the first switch 232 and the second switch 234 are opened when the output block 210 is enabled so that the input block 220 feeds back the signal OUT and the bar signal OUTB outputted by the output block 210. When the output block 210 is disabled, that is, when a signal and a bar signal are inputted from an external circuit, the first switch 232 and the second switch 234 are closed to transfer the signal and the bar signal inputted by the input block 220 to the internal circuit of the semiconductor integrated circuit.

The interface apparatus 200 also includes a phase detector 240 which receives output signals OUT" and OUTB", which are signals whose signal levels have been transformed into set levels by the input block 220, and outputs a detection signal DS corresponding to a phase difference value between the output signal OUT" and the output bar signal OUTB", since the first switch 232 and the second switch 234 are open. The VOX may be indirectly measured from the detection signal DS outputted by the phase detector 240. Since the phase detector 240 has the same structure as the phase detector 140 of the first embodiment of the present invention, a further description thereof has not been provided herein.

The interface apparatus 200 also includes a control signal generator 250, which generates and outputs a control signal CS for controlling a controller 260, which is described below, based on the detection signal DS outputted by the phase detector 240. The control signal generator 250 may be an analog control signal generator or a digital control signal generator. Since the control signal generator 250 also has the same structure as the control signal generator 150 of the first embodiment of the present invention, further description thereof has not been provided herein.

The interface apparatus 200 also includes a controller 260 for controlling the VOX of the signal IN and the bar signal INB inputted by the internal circuit and outputted to the output block 210 upon receipt of an analog or digital control signal CS outputted by the control signal generator 250. In the embodiments of the present invention, controlling the VOX corresponds to controlling either the time delay or the duty cycle of the signal IN and the bar signal INB. Since the controller 260 has the same structure as the controller 160, a further description thereof has not been provided herein.

Hereafter, an operation of the interface apparatus in accordance with the second embodiment of the present invention is described below, referring to FIG. 8.

FIG. 8 is a flowchart illustrating an interfacing method of the interface apparatus in accordance with the second embodiment of the present invention.

Herein, it is assumed in the description of the second embodiment that controlling VOX corresponds to controlling a time delay.

Referring to FIG. 8, in step S210, an output block 210 is enabled by an output enable signal EN. In step S202, the output block 210 begins to be driven and enters into an output stand-by state and at the same time a first switch 232 and a second switch 234 are controlled to be open. Since the first switch 232 and the second switch 234 are open, an input block 220 is switched from an input stand-by state to a feedback stand-by state.

When a signal IN and a bar signal INB output by an internal circuit of a semiconductor integrated circuit are transferred to the output block 210 by bypassing a controller 260 in step S204, the output block 210 transforms the received signal IN and bar signal INB to have signals having levels appropriate for an external circuit and outputs the resultant signals having transformed signal levels, that is, an output signal OUT and an output bar signal OUTB in step S206.

Subsequently, in step S208, the input block 220 feeds back the outputted signals OUT and OUTB, transforms them into an output signal OUT' and an output bar signal OUTB', which have the original signal levels, and transfers the output signal OUT' and the output bar signal OUTB' to a phase detector 240.

In step S210, the phase detector 240 detects a phase difference between the output signals OUT' and OUTB', output by the input block 220 and, in step S212, outputs a detection signal DS corresponding to the detected phase difference (see FIGS. 6A to 6C). The VOX may be indirectly measured from the detection signal DS.

In step S214, a control signal generator 250 receives the detection signal DS outputted by the phase detector 240, generates either an analog control signal CS or a digital control signal CS in response to the detection signal DS outputted by the phase detector 240 and outputs the generated analog or digital control signal CS to a controller 260.

The controller 260 controls a delay of the signal IN and the bar signal INB output by the internal circuit to the output block 210 based on the received analog or digital control signal CS. In other words, the controller 260 controls the VOX of the signal IN and the bar signal INB to a normal level, which may be referred to as a target level. In this embodiment, controlling the VOX is described as controlling the time delay of the signal IN and the bar signal INB for the sake of convenience in description. However, it is apparent to those skilled in the art that a duty cycle may be controlled when the VOX of the signal IN and the bar signal INB is controlled.

According to the second embodiment of the present invention, outputting the signal IN and bar signal INB with the VOX controlled to the target level not only improves the reliability of the bi-directional interface apparatus of a semiconductor integrated circuit, but also minimizes the integrated circuit area increase due to the additional circuitry by utilizing the input block for feeding back the output signals of the output block.

Figure 9:
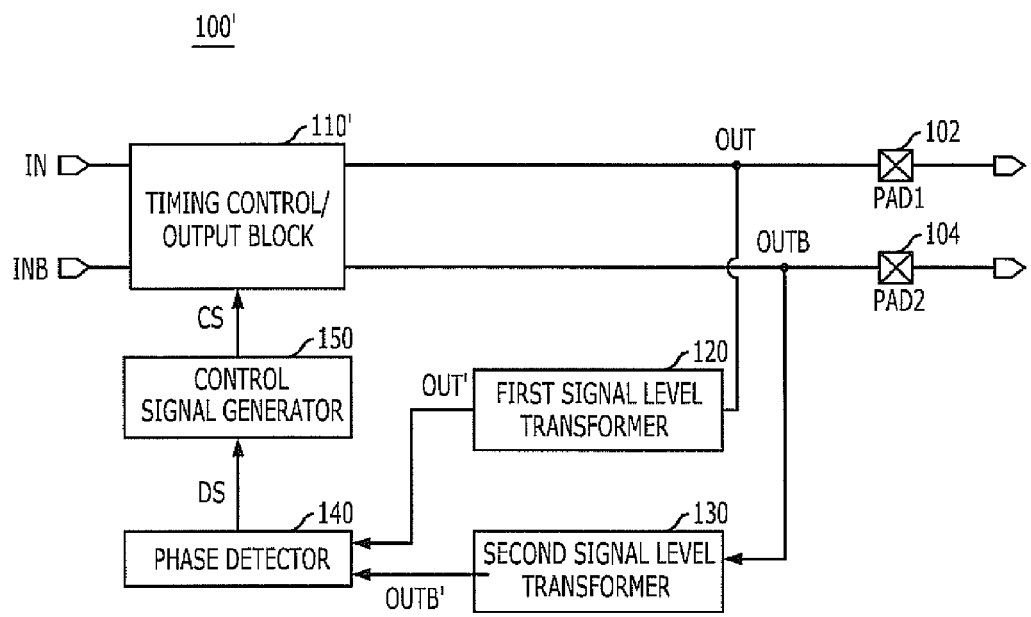
FIG. 9 is a block diagram illustrating an interface apparatus of a semiconductor integrated circuit in accordance with a third embodiment of the present invention.
Figure 10:
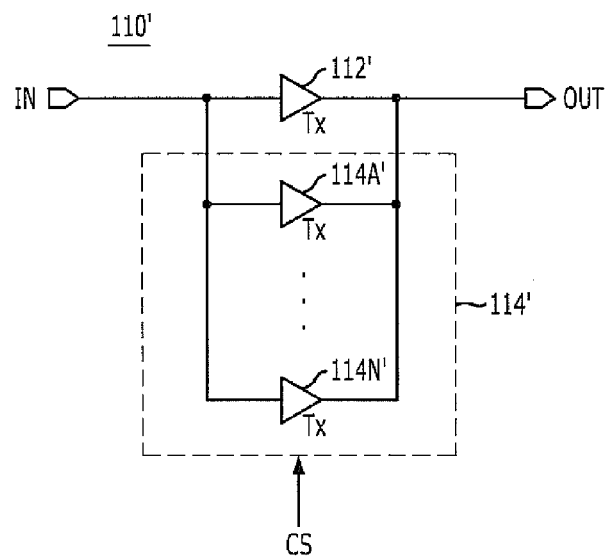
FIG. 10 is a circuit diagram illustrating an output controller shown in FIG. 9.

FIG. 9 is a block diagram illustrating an interface apparatus of a semiconductor integrated circuit in accordance with a third embodiment of the present invention. FIG. 10 is a circuit diagram illustrating an output controller shown in FIG. 9. For the sake of convenience in description, only a line for a signal IN is illustrated in FIG. 10.

The third embodiment of the present invention is designed to control a slew of a signal and a bar signal generated by an internal circuit of a semiconductor integrated circuit. The interface apparatus in accordance with the third embodiment of the present invention may be applied to both a one-directional interface apparatus and a bi-directional interface apparatus. The same reference numerals are given to the same constituent elements as those shown in the first embodiment and a description on the same constituent elements has been omitted herein.

Referring to FIGS. 9 and 10, the interface apparatus 100' includes a timing control and output block 110' for controlling slews of a signal IN and a bar signal INB generated by an internal circuit (not shown) and outputting slew-controlled signals IN and INB. The timing control and output block 110' includes a first output buffer 112' disposed on a line for the signal IN and a slew controller 114' for controlling a slew of the signal IN generated by the internal circuit in response to a control signal CS of a control signal generator 150. The slew controller 114' includes a plurality of transmitters 114A' and 114N', at least one of which is coupled to the first output buffer 112' in parallel. Herein, the plurality of the transmitters 114A' and 114N' may be formed to have either the same driving power as the driving power of the first output buffer 112', or they may be formed to have a different driving power from the driving power of the first output buffer 112'. Although not illustrated in the drawings for the sake of convenience in description, it is apparent that the timing control and output block 110' includes a second output buffer disposed on a line for the bar signal INB and a slew controller coupled to the second output buffer in parallel.

Hereafter, an interfacing method of the interface apparatus for a semiconductor integrated circuit in accordance with the third embodiment of the present invention is described. When a signal IN and a bar signal INB generated by an internal circuit are outputted by bypassing a timing control and output block 110', the signals IN and INB are fed back by a first signal level transformer 120 and a second signal level transformer 130 to be transferred to a phase detector 140. Herein, the signals are labeled OUT' and OUTB'.

The phase detector 140 detects a phase difference between the signals OUT' and OUTB' and outputs a detection signal DS corresponding to the detected phase difference. Herein, the VOX is indirectly measured from the outputted detection signal DS.

The control signal generator 150 generates a control signal CS in response to the detection signal DS outputted by the phase detector 140. The generated control signal CS is transferred to the slew controller 114' of the timing control and output block 110'.

Accordingly, the slew controller 114' additionally drives an output terminal of the first output buffer 112' and controls a slew in response to the control signal CS. Herein, controlling a slew corresponds to controlling the VOX of the signal IN and the bar signal INB generated by the internal circuit to a normal level, which is a target level.

In the first to third embodiments of the present invention, the VOX is measured in real-time and controlled to be its normal level whenever a signal and a bar signal are outputted in an active operation period of a semiconductor integrated circuit. However, according to a fourth embodiment, a semiconductor integrated circuit may measure the VOX in the initial operation period during a power-up, store the measured VOX value, and control the VOX of a signal and a bar signal to a normal level based on the stored measured VOX value upon the signal and the bar signal being outputted in an active operation period.

Furthermore, in the fourth embodiment of the present invention, the VOX is re-measured during a set time interval in a stand-by period of the semiconductor integrated circuit and the re-measured VOX value is updated. Subsequently, the VOX of a signal and a bar signal may be controlled to a normal level based on the updated re-measured VOX value in an active operation period.

The interface apparatus for a semiconductor integrated circuit and the interfacing method thereof can transfer signals with an improved reliability by controlling the VOX of a differential signal outputted by an output block to a target level.

In particular, a bi-directional interface apparatus for a semiconductor integrated circuit including an input block and an output block uses a pre-established input block as a structure for feeding back the differential signal outputted by the output block, resulting in a minimized required integrated circuit area and a reduced wasteful consumption of power.

While the present invention has been described with respect to specific embodiments, it will be apparent to those skilled in the art that various changes and modifications may be made without departing from the spirit and scope of the present invention as defined by the following claims.

What is claimed is:

1. An interface apparatus for a semiconductor integrated circuit, comprising:
   an output block configured to output differential signals generated by an internal circuit, wherein the output block comprises a plurality of transmitters configured to output the differential signals;
   a feed back block configured to feed back the differential signals outputted from the plurality of transmitters, wherein the feed back block comprises a plurality of signal level transformers configured to transform signal levels of the differential signals outputted by the plurality of transmitters into signal levels for the internal circuit;
   a detector configured to detect a timing error of the differential signals; and
   a controller configured to control a timing of the differential signals generated by the internal circuit according to a detection result of the detector.

2. The interface apparatus of claim 1, wherein the plurality of signal level transformers correspond one-to-one to the plurality of transmitters and are configured to transfer the differential signals transformed by the signal level transformers to the detector.

3. The interface apparatus of claim 1, wherein each of the plurality of signal level transformers includes either at least one inverter or at least one amplifier.

4. The interface apparatus of claim 1, wherein the feed back block comprises an input block including a plurality of receivers corresponding one-to-one to the plurality of transmitters.

5. The interface apparatus of claim 4, further comprising a switching block including a plurality of switches corresponding one-to-one to the plurality of receivers, the plurality of switches selectively switching signal transmission lines to be connected or disconnected, the signal transmission lines being arranged between the internal circuit and the plurality of receivers.

6. The interface apparatus of claim 5, wherein the switching block connects the switching signal transmission lines in response to the output block being enabled, and the switching block disconnects the switching signal transmission lines in response to the output block being disabled.

7. The interface apparatus of claim 1, wherein the detector comprises a phase detector configured to detect a phase difference between the differential signals to detect a timing error and to output a detection signal of either a logic high level or a logic low level according to a detection result thereof.

8. The interface apparatus of claim 7, further comprising a control signal generator configured to generate a control signal to control a timing of the differential signals output by the internal circuit and to transfer the control signal to the controller according to the detection signal.

9. The interface apparatus of claim 8, wherein the control signal generator comprises:
   a charge pump configured to supply an output current according to the detection signal; and
   a loop filter configured to output an analog control signal having a set voltage level according to the output current supplied by the charge pump.

10. The interface apparatus of claim 8, wherein the control signal generator comprises:
    a counter configured to count the detection signal of either a logic high level or a logic low level according to a clock; and
    a digital filter configured to filter an output signal of the counter.

11. The interface apparatus of claim 1, wherein the detector comprises a phase detector configured to detect a phase difference between the differential signals to detect a timing error and to output a pulse signal according to a detection result.

12. The interface apparatus of claim 11, further comprising a control signal generator configured to generate a control signal to control a timing of the differential signals output by the internal circuit according to the pulse signal and to transfer the control signal to the controller.

13. The interface apparatus of claim 12, wherein the control signal generator comprises:
    a charge pump configured to supply an output current according to the pulse signal; and a loop filter configured to output an analog control signal having a set voltage level according to the output current supplied by the charge pump.

14. The interface apparatus of claim 13, wherein the control signal generator comprises:
a signal pulse width expander configured to expand a pulse width of the pulse signal by a set pulse width;
a sampler configured to sample an inputted clock signal during a time period according to an output signal of the signal pulse width expander; and
a counter configured to count a sampled clock signal output by the sampler.

15. The interface apparatus of claim 14, wherein the signal pulse width expander comprises a skewed delay circuit.

16. The interface apparatus of claim 1, wherein the controller is arranged on a signal transmission line between the internal circuit and the output block and controls a delay of the differential signals output by the internal circuit.

17. The interface apparatus of claim 1, wherein the controller is arranged on a signal transmission line between the internal circuit and the output block and controls a duty cycle of the differential signals output by the internal circuit.

18. An interfacing method of a semiconductor integrated circuit, comprising:
outputting differential signals generated by an internal circuit, wherein the outputting of the differential signals is performed by a plurality of transmitters;
feeding back the differential signals outputted from the plurality of transmitters after transforming signal levels of the differential signals outputted by the plurality of transmitters into signal levels for the internal circuit;
detecting a timing error of the differential signals; and
controlling a timing of the differential signals generated by the internal circuit according to a result of the detection.

* * * * *